United States Patent
Huang et al.

(10) Patent No.: US 11,275,403 B2
(45) Date of Patent: Mar. 15, 2022

(54) TILED DISPLAY DEVICE

(71) Applicant: InnoLux Corporation, Miao-Li County (TW)

(72) Inventors: Wan-Ling Huang, Miao-Li County (TW); Shu-Ming Kuo, Miao-Li County (TW); Tsau-Hua Hsieh, Miao-Li County (TW); Chun-Hsien Lin, Miao-Li County (TW); Tzu-Min Yan, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 197 days.

(21) Appl. No.: 16/792,903

(22) Filed: Feb. 18, 2020

(65) Prior Publication Data

US 2020/0285271 A1  Sep. 10, 2020

Related U.S. Application Data

(60) Provisional application No. 62/815,373, filed on Mar. 8, 2019.

(30) Foreign Application Priority Data

Oct. 21, 2019 (CN) .......................... 201911002432.5

(51) Int. Cl.
  *G09F 3/02* (2006.01)
  *G06F 1/16* (2006.01)
  *G09F 9/302* (2006.01)

(52) U.S. Cl.
  CPC .......... *G06F 1/1601* (2013.01); *G09F 9/3026* (2013.01)

(58) Field of Classification Search
  None
  See application file for complete search history.

(56) References Cited

U.S. PATENT DOCUMENTS 9,261,724 B2 * 2/2016 Zhang ............... G02F 1/133308
9,414,503 B2 * 8/2016 Lee ...................... H05K 5/0017
(Continued)

FOREIGN PATENT DOCUMENTS

CN       103650020 A    3/2014
CN       108267901 A    7/2018
KR  10-2018-0051116 A   5/2018

*Primary Examiner* — Xanthia C Cunningham
(74) *Attorney, Agent, or Firm* — Winston Hsu

(57) ABSTRACT

A tiled display device includes a first panel. The first panel includes a first lower substrate and a first upper substrate disposed opposite to the first lower substrate. The first upper substrate includes a first upper surface, a first lower surface and a first side surface located between the first upper surface and the first lower surface. The tiled display device further includes a second panel disposed adjacent to the first panel. The second panel includes a second lower substrate and a second upper substrate disposed opposite to the second lower substrate. The second upper substrate includes a second upper surface, a second lower surface and a second side surface located between the second upper surface and the second lower surface. The second side surface is disposed adjacent to the first side surface. A portion of the first side surface is not perpendicular to the first upper surface or the first lower surface, and a portion of the second side surface is not perpendicular to the second upper surface or the second lower surface.

19 Claims, 9 Drawing Sheets

(56) References Cited

U.S. PATENT DOCUMENTS

| | | | |
|---|---|---|---|
| 10,104,788 B2 * | 10/2018 | Choi | H01L 51/5281 |
| 2003/0231144 A1 * | 12/2003 | Cho | G02F 1/13336 |
| | | | 345/1.3 |
| 2008/0158468 A1 * | 7/2008 | Kim | G02F 1/13336 |
| | | | 349/58 |
| 2011/0164200 A1 * | 7/2011 | Watanabe | G02F 1/13336 |
| | | | 349/58 |
| 2014/0104712 A1 * | 4/2014 | Sekiguchi | G02B 5/10 |
| | | | 359/850 |
| 2014/0218918 A1 | 8/2014 | Moriwaki | |
| 2015/0286457 A1 * | 10/2015 | Kim | G02B 3/0037 |
| | | | 345/581 |
| 2017/0017453 A1 | 1/2017 | Hoshino | |
| 2017/0086308 A1 | 3/2017 | Large | |
| 2017/0141173 A1 * | 5/2017 | Choi | G06F 1/1652 |
| 2017/0145725 A1 * | 5/2017 | Siddiqui | E05F 3/20 |
| 2017/0329567 A1 * | 11/2017 | Choi | H05K 5/0021 |
| 2019/0305073 A1 * | 10/2019 | Chen | H01L 27/3293 |

* cited by examiner

TILED DISPLAY DEVICE

CROSS REFERENCE TO RELATED APPLICATION

This application claims the benefit of U.S. Provisional Patent Application No. 62/815,373, filed on Mar. 8, 2019, the content of which is hereby incorporated by reference in its entirety.

BACKGROUND OF THE DISCLOSURE

1. Field of the Disclosure

The present disclosure relates to a tiled display device, more particularly to a tiled display device with designs in the border of the substrate thereof.

2. Description of the Prior Art

In the present electronic devices, the light emitting elements would be disposed in panels with fixed size, and the panels with fixed size would be jointed to achieve the electronic device with greater area. However, when the tiled device is in display, obvious bright line or dark line may be observed in the seam of the tiled device because that the light path near the edge of the substrate is different from the light path in other regions, thereby affecting the performance of the electronic device. In summary, to improve the design and display performance of the tiled device has become an important issue in electronic industries.

SUMMARY OF THE DISCLOSURE

One of the purposes of the present disclosure is to provide a tiled device, wherein the border of the substrate of the tiled device has a structure design to reduce the bright line or dark line around the seam of the device, thereby improving display performance of the tiled device.

In some embodiments, the present disclosure provides a tiled display device. The tiled display device includes a first panel and a second panel. The first panel includes a first lower substrate and a first upper substrate disposed opposite to the first lower substrate. The first upper substrate includes a first upper surface, a first lower surface and a first side surface located between the first upper surface and the first lower surface. The second panel is disposed adjacent to the first panel, and includes a second lower substrate and a second upper substrate disposed opposite to the second lower substrate. The second upper substrate includes a second upper surface, a second lower surface and a second side surface located between the second upper surface and the second lower surface, and the second side surface is disposed adjacent to the first side surface. A portion of the first side surface is not perpendicular to the first upper surface or the first lower surface, and a portion of the second side surface is not perpendicular to the second upper surface or the second lower surface.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function.

In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

Figure 1:
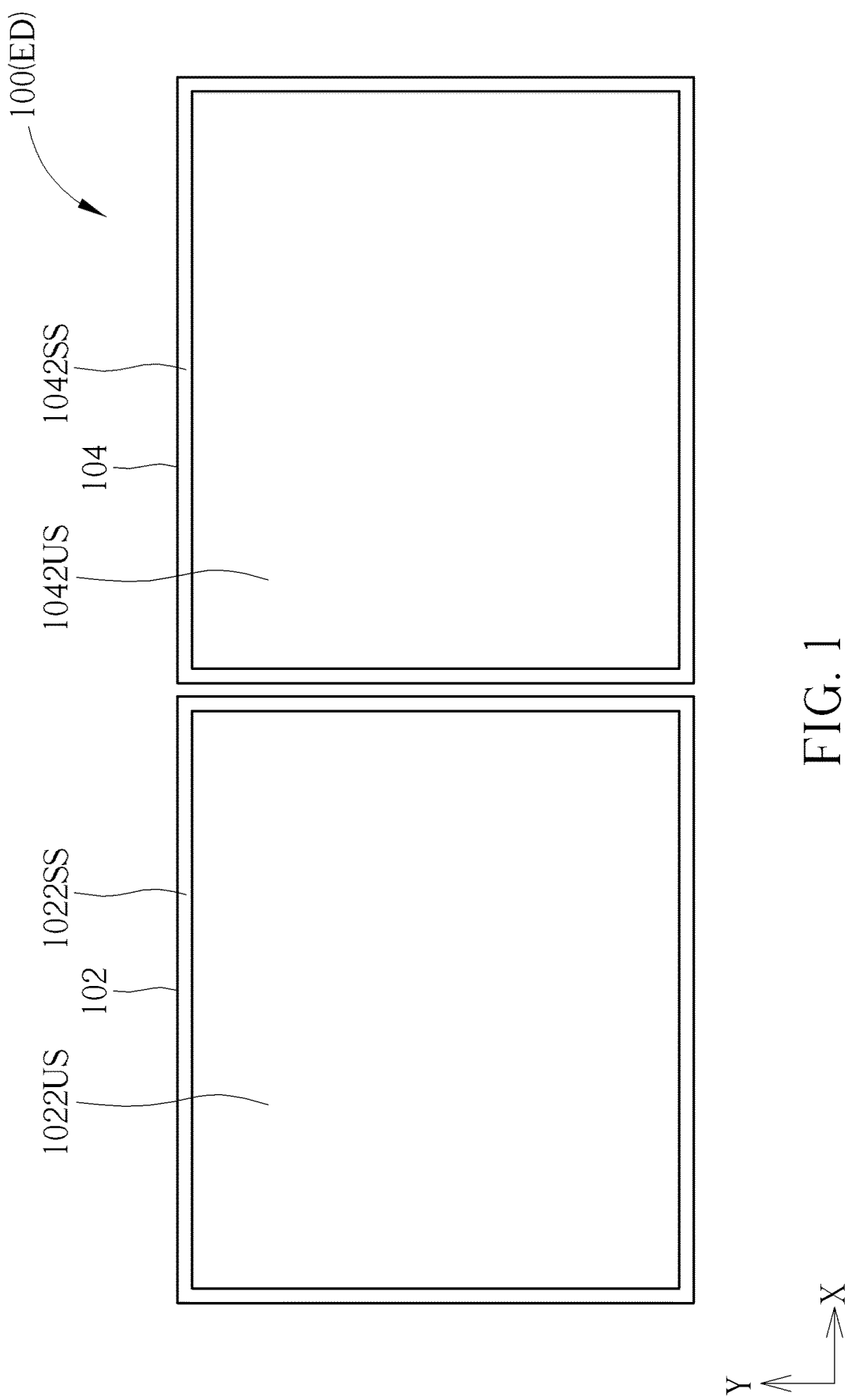
FIG. 1 schematically illustrates a top view of the electronic device according to a first embodiment of the present disclosure.
Figure 2:
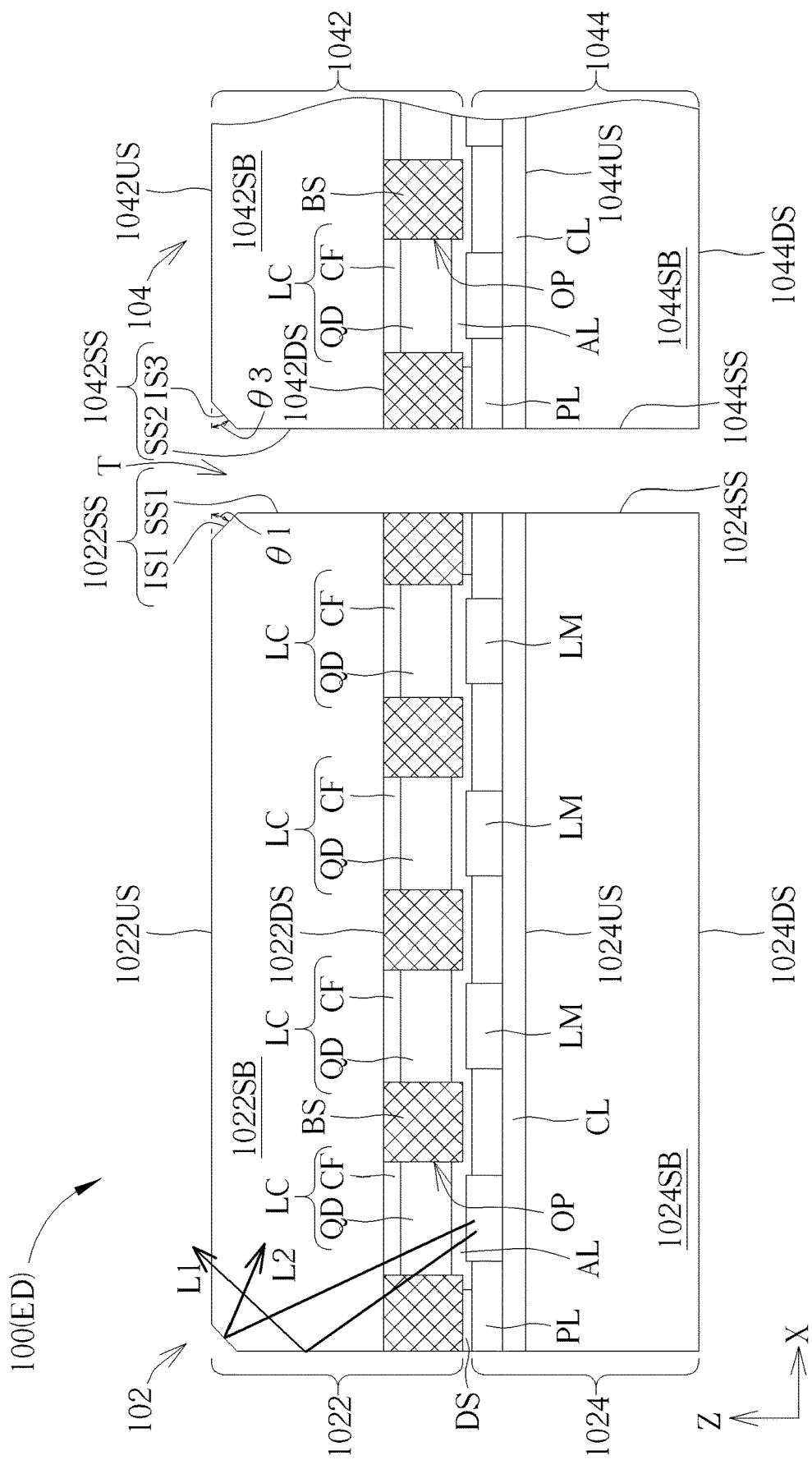
FIG. 2 schematically illustrates a cross-sectional view of the electronic device according to the first embodiment of the present disclosure.

Refer to FIG. 1 and FIG. 2. FIG. 1 schematically illustrates a top view of the electronic device according to a first embodiment of the present disclosure, and FIG. 2 schematically illustrates a cross-sectional view of the electronic device according to the first embodiment of the present disclosure. As shown in FIG. 1, the electronic device ED may include a display device 100 such as a tiled display device, and may for example include a first panel 102 and a second panel 104 adjacent to the first panel 102. The first panel 102 and the second panel 104 may be jointed to provide display function, but not limited thereto. The first panel 102 and the second panel 104 of the present disclosure may for example include display device, antenna or sensing device, but not limited thereto. The display device 100 including the first panel 102 and the second panel 104 may for example be applied to public display, tiled display, vehicle display, display, touch display, light source module, television, smart phone, tablet computer, laptop computer, lighting equipment or other electronic device applied to the devices mentioned above, but not limited thereto. Although FIG. 1 only shows two panel structures (first panel 102 and second panel 104), but the present disclosure is not limited thereto. In some embodiments, the display device 100 may include three or more panel structures. Furthermore, although it is not shown in FIG. 1, a cover substrate or a protection layer may be arranged to cover the first panel 102 and/or the second panel 104 of the display device 100, but not limited thereto. The cover substrate or protection layer may be or may not be disposed on the first panel and/or the second panel of the electronic devices or display devices in the following embodiments, which will not be redundantly described below. According to this embodiment, the first panel 102 may include a first upper substrate 1022 and a first lower substrate 1024, as shown in FIG. 2. In some embodiments, the first panel 102 may include three or more substrates, and the present disclosure is not limited thereto.

As shown in FIG. 2, in this embodiment, the first upper substrate 1022 may for example include a first upper base 1022SB and the layers or elements disposed on the surface of the first upper base 1022SB such as light shielding layer BS and light conversion layer LC, but not limited thereto. The first lower substrate 1024 may include a first lower base 1024SB and the layers or elements disposed on the surface of the first lower base 1024SB such as circuit layer CL, light emitting element LM and filling layer PL, but not limited thereto. The material of the light shielding layer BS may for example include black matrix (BM), black photoresist, black ink, black resin, other suitable materials or the combination of the above-mentioned materials, but not limited thereto. The light conversion layer LC may selectively include a first conversion layer CF and/or a second conversion layer QD. For example, the first conversion layer CF may include color filters, such as red color filter, blue color filter, green color filter and/or color filters with other colors, but not limited thereto. In some embodiments, the first conversion layer CF may selectively be omitted or replaced by other insulating materials. The second conversion layer QD may for example include quantum dot, fluorescent material, phosphorescent material, color filter, other suitable light shielding materials or the combinations of the above-mentioned materials. The quantum dot may be formed of semiconductor nano-crystal structures such as cadmium selenide (CdSe), cadmium sulfide (CdS), cadmium telluride (CdTe), zinc selenide (ZnSe), zinc telluride (ZnTe), zinc sulfide (ZnS), mercury telluride (HgTe), indium arsenide (InAs), alloy ($Cd_{1-x}Zn_xSe_{1-y}S_y$), cadmium selenide/zinc sulfide (CdSe/ZnS), indium phosphide (InP) and gallium arsenide (GaAs), but not limited thereto. The first conversion layer CF and/or the second conversion layer QD may be disposed in the openings OP defined by the light shielding layer BS, and the openings OP can define the light-emitting region of the first panel 102, but not limited thereto. Besides, although the display device 100 shown in FIG. 2 includes the first conversion layer CF and the second conversion layer QD, the present disclosure is not limited thereto. In some embodiments, the display device 100 may selectively include one of the first conversion layer CF or the second conversion layer QD. The circuit layer CL may include various kinds of conductive lines, circuits and/or electronic elements such as driving elements, switch elements, scan lines and/or data lines (not shown in FIG. 2), wherein the circuit layer CL may be electrically connected to the light emitting elements LM to control light emission of the light emitting elements LM, but not limited thereto. According to some embodiments, the light emitting elements LM may include light emitting diodes (LED) such as organic light emitting diodes (OLED), quantum dot light emitting diodes (QLED), mini light emitting diodes (mini LED), micro light emitting diodes (micro LED) or the combinations of the above-mentioned LEDs, but not limited thereto.

The elements and layers included in the second panel 104 may be the same as the elements and layers of the first panel 102, which will not be redundantly described here. In this embodiment, the first upper substrate 1022 may for example be adhered to the first lower substrate 1024 through an encapsulation layer AL or side sealing material DS, but not limited thereto.

According to this embodiment, the first upper base 1022SB may include a first upper surface 1022US, a first lower surface 1022DS and a first side surface 1022SS located between the first upper surface 1022US and the first lower surface 1022DS, and the second upper base 1042SB of the second upper substrate 1042 may include a second upper surface 1042US, a second lower surface 1042DS and a second side surface 1042SS located between the second upper surface 1042US and the second lower surface 1042DS, as shown in FIG. 2. Because the first panel 102 is adjacent to the second panel 104, the first side surface 1022SS is disposed adjacent to the second side surface 1042SS. It should be noted that because the thicknesses of the layers on the base (such as the first upper base 1022SB or the second upper base 1042SB) are much less than the thickness of the base, each of the bases in the embodiments of the present disclosure may stand for the corresponding substrate thereof. For example, when mentioning the first upper substrate 1022, it means that the first upper substrate 1022 may include the first upper base 1022SB and the layers thereon, the first upper surface 1022US, the first lower surface 1022DS and the first side surface 1022SS of the first upper base 1022SB may be regarded as the upper surface, the lower surface and the side surface of the first upper substrate 1022, and the thickness of the first upper base 1022SB may be regarded as the thickness of the first upper substrate 1022. When mentioning the first lower substrate 1024, it means that the first lower substrate 1024 may include the first lower base 1024SB and the layers thereon, the third upper surface 1024US, the third lower surface 1024DS and the third side surface 1024SS of the first lower base 1024SB may be regarded as the upper surface, the lower surface and the side surface of the first lower substrate 1024, and the thickness of the first lower base 1024SB may be regarded as the thickness of the first lower substrate 1024. When mentioning the second upper substrate 1042, it means that the second upper substrate 1042 may include the second upper base 1042SB and the layers thereon, the second upper surface 1042US, the second lower surface 1042DS and the second side surface 1042SS of the second upper base 1042SB may be regarded as the upper surface, the lower surface and the side surface of the second upper substrate 1042, and the thickness of the second upper base 1042SB may be regarded as the thickness of the second upper substrate 1042. When mentioning the second lower substrate 1044, it means that the second lower substrate 1044 may include the second lower base 1044SB and the layers thereon, the fourth upper surface 1044US, the fourth lower surface 1044DS and the fourth side surface 1044SS of the second lower base 1044SB may be regarded as the upper surface, the lower surface and the side surface of the second lower substrate 1044, and the thickness of the second lower base 1044SB may be regarded as the thickness of the second lower substrate 1044. The layers mentioned above may for example include light conversion layer LC, light shielding layer BS, circuit layer CL and/or filling layer PL, but not limited thereto. The first upper base 1022SB, the first lower base 1024SB, the second upper base 1042SB and the second lower base 1044SB may for example be a flexible substrate, a rigid substrate or the combination of the above-mentioned substrates respectively. In some embodiments, the material of the first upper base 1022SB, the first lower base 1024SB, the second upper base 1042SB and the second lower base 1044SB may include glass, quartz, ceramics, sapphire, other suitable materials or the combinations of the above-mentioned materials, but not limited thereto.

In this embodiment, as shown in FIG. 2, the first side surface 1022SS may include a side portion SS1 and a inclined portion IS1 connected to the first upper surface 1022US, wherein the side portion SS1 is substantially perpendicular to the first upper surface 1022US and/or the first lower surface 1022DS, and the inclined portion IS1 is not perpendicular to the first upper surface 1022US and/or the first lower surface 1022DS. That is, a portion of the first side surface 1022SS may not be perpendicular to the first upper surface 1022US and/or the first lower surface 1022DS in this embodiment, and the inclined portion IS1 is not parallel to the side portion SS1. Another side surface of the first upper base 1022SB, which is opposite to the first side surface 1022SS, may include inclined portion or not. The second side surface 1042SS may include a inclined portion IS3 and a side portion SS2, wherein the side portion SS2 is substantially perpendicular to the second upper surface 1042US and/or the second lower surface 1042DS, and the inclined portion IS3 is not perpendicular to the second upper surface 1042US and/or the second lower surface 1042DS. That is, a portion of the second side surface 1042SS may not be perpendicular to the second upper surface 1042US and the second lower surface 1042DS, and the inclined portion IS3 is not parallel to the side portion SS3. The inclined portion IS1 and inclined portion IS3 may for example be formed by cutting through a diamond cutting wheel or laser, mechanical grinding or other chemical etching methods, but not limited thereto. The inclined portion IS1 and the extension line of the first upper surface 1022US have an included angle $\theta 1$, the inclined portion IS3 and the extension line of the second upper surface 1042US have an included angle $\theta 3$, wherein the included angle $\theta 1$ and the included angle $\theta 3$ may be greater than 0 degree and less than 90 degrees ($0°<\theta 1, \theta 3<90°$). For example, the included angle $\theta 1$ and the included angle $\theta 3$ may range from 20 degrees to 45 degrees ($20°\leq \theta 1, \theta 3 \leq 45°$) in this embodiment, but not limited thereto. It should be noted that although the included angle $\theta 1$ is the same as the included angle $\theta 3$ in FIG. 2, the present disclosure is not limited thereto. The included angle $\theta 1$ may be the same as or different from the included angle $\theta 3$ in this embodiment. Because the first side surface 1022SS has the inclined portion IS1, and/or the second side surface 1042SS has the inclined portion IS3, after the first panel 102 and the second panel 104 are jointed to form the display device 100 with greater area, the light direction of a portion of the light (for example, the light L1 and light L2 shown in FIG. 2) emitted from the light emitting elements LM would be changed due to multiple reflections of the light when it went through the upper surfaces, the inclined portions and the side surfaces, such that the output light would not be easily focused on the same direction, and the bright lines or dark lines produced at seam T of the display device 100 due to leakage of light in large viewing angle may be reduced, thereby improving the display quality of the display device 100, but not limited thereto. It should be noted that although the first side surface 1022SS and the second side surface 1042SS shown in FIG. 2 have only one inclined portion (inclined portion IS1 and inclined portion IS3 respectively), the present disclosure is not limited thereto. In some embodiments, the first side surface 1022SS and the second side surface 1042SS may include two or more inclined portions, but not limited thereto.

Continuing referring to FIG. 2, the first lower substrate 1024 may include a third upper surface 1024US, a third lower surface 1024DS and a third side surface 1024SS, and the second lower substrate 1044 may include a fourth upper surface 1044US, a fourth lower surface 1044DS and a fourth side surface 1044SS. In some embodiments, the third side surface 1024SS may include inclined portion (not shown), and the fourth side surface 1044SS may include inclined surface (not shown). Besides, the number of the inclined portion of the first side surface 1022SS may not be the same as the number of the inclined portion of the second side surface 1042SS. For example, when the first side surface 1022SS includes one inclined portion (such as inclined portion IS1), the second side surface 1042SS may not include inclined portion or include more than one inclined portions, but not limited thereto.

Figure 3:
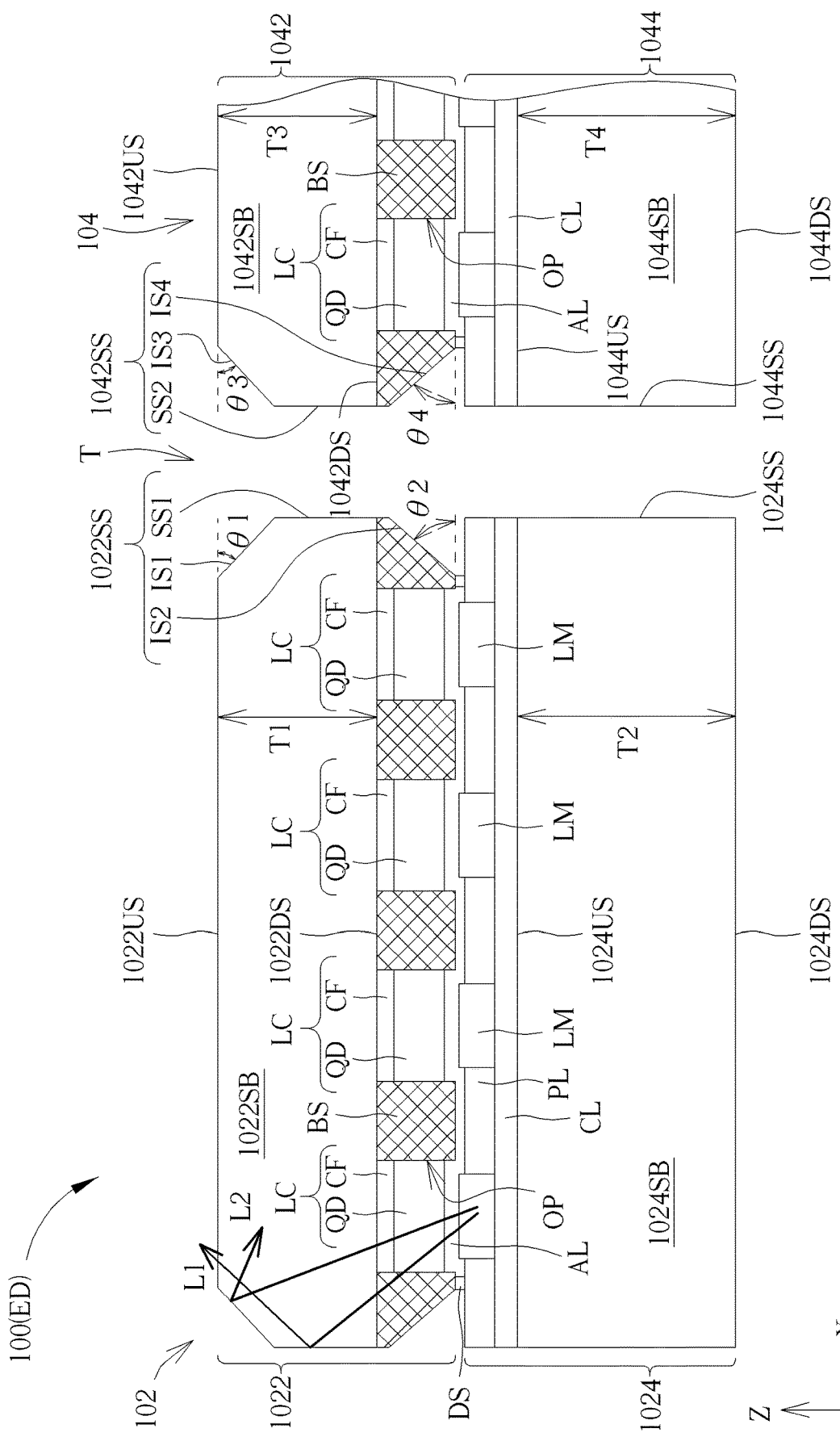
FIG. 3 schematically illustrates a cross-sectional view of the electronic device according to a second embodiment of the present disclosure.

Referring to FIG. 3, FIG. 3 schematically illustrates a cross-sectional view of the electronic device according to a second embodiment of the present disclosure. In this embodiment and the below-mentioned embodiments, the layers or elements located between the first upper substrate 1022 and the first lower substrate 1024 of the first panel 102 (or between the second upper substrate 1042 and the second lower substrate 1044 of the second panel 104) may be the same as the layers or elements in the first embodiment, and will not be redundantly described herein. One of the main differences between this embodiment and the first embodiment shown in FIG. 2 is that the first side surface 1022SS of the first upper substrate 1022 and the second side surface 1042SS of the second upper substrate 1042 may include more than one inclined portions. As shown in FIG. 3, the first side surface 1022SS includes an inclined portion IS1 and an inclined portion IS2 which are not perpendicular to the first upper surface 1022US and/or the first lower surface 1022DS, and includes a side portion SS1 which is perpendicular to the first upper surface 1022US and/or the first lower surface 1022DS. The second side surface 1042SS includes a inclined portion IS3 and a inclined portion IS4 which are not perpendicular to the second upper surface 1042US and the second lower surface 1042DS, and includes a side portion SS2 which is perpendicular to the second upper surface 1042US and the second lower surface 1042DS. The inclined portion IS1 is connected to the first upper surface 1022US, the inclined portion IS2 is connected to the first lower surface 1022DS, the inclined portion IS3 is connected to the second upper surface 1042US, and the inclined portion IS4 is connected to the second lower surface 1042DS. The inclined portion IS1 of the first upper substrate 1022 and the inclined portion IS3 of the second upper substrate 1042 may refer to the first embodiment, and will not be redundantly described here. The inclined portion IS2 and the extending line or extending direction of the first lower surface 1022DS (for example, the extending direction of the first lower surface 1022DS is the X direction, as shown in FIG. 3) have an included angle θ2, and the inclined portion IS4 and the extending line or extending direction of the second lower surface 1042DS (such as X direction) have an included angle θ4. The included angle θ2 and the included angle θ4 may refer to the included angle θ1 and included angle θ3 in the first embodiment, and will not be redundantly described here. It should be noted that although the degrees of the included angle θ1, the included angle θ2, the included angle θ3 and the included angle θ4 are the same in FIG. 3, the present disclosure is not limited thereto. In some embodiments, the included angle θ1 may be the same as the included angle θ2, but different from the included angle θ3 and the included angle θ4, or, in some other embodiments, the included angle θ1, the included angle θ2, the included angle θ3 and the included angle θ4 are different from each other, but not limited thereto. According to this embodiment, because the side surface (the first side surface 1022SS and the second side surface 1042SS) of the first upper substrate 1022 and the second upper substrate 1042 respectively include an inclined portion IS2 connected to the first lower surface 1022DS and an inclined portion IS4 connected to the second lower surface 1042DS, the light direction of a portion of the light emitted from the light emitting element LM would be changed due to multiple reflections of the light when it went through the lower surfaces, the inclined portions and the side surfaces, such that the output light would not be easily focused on the same direction, and the bright lines or dark lines produced at seam T of the display device 100 due to leakage of light in large viewing angle may be reduced, thereby mitigating the visualization of the seam when users are watching the display device, and the display quality of the display device 100 may be improved. The effect of the inclined portion IS1 and inclined portion IS3 may refer to the first embodiment, and will not be redundantly described here. Besides, according to this embodiment, because more layers or elements (such as light emitting element, switch element, circuit, and the like) may be disposed on the first lower substrate 1024 and/or the second lower substrate 1044, the thickness T2 of the first lower base 1024SB may be greater than the thickness T1 of the first upper base 1022SB, and the thickness T4 of the second lower base 1044SB may be greater than the thickness T3 of the second upper base 1042SB, but not limited thereto. It should be noted that although the thickness T2 is the same as the thickness T4, and the thickness T1 is the same as the thickness T3 in the display device 100 shown in FIG. 3, the present disclosure is not limited thereto. For example, the thickness T1 may be different from the thickness T3, and the thickness T2 may be different from the thickness T4 in some embodiments. The descriptions and relationship of thickness T1, thickness T2, thickness T3 and thickness T4 may be applied to other embodiments of the present disclosure, and will not be redundantly described. Besides, the number of the inclined portion and the included angle between the inclined portion and the surface in the third side surface 1024SS may be different from the first side surface 1022SS, the second side surface 1042SS and the fourth side surface 1044SS, which is not limited to what is shown in FIG. 3.

Figure 4:
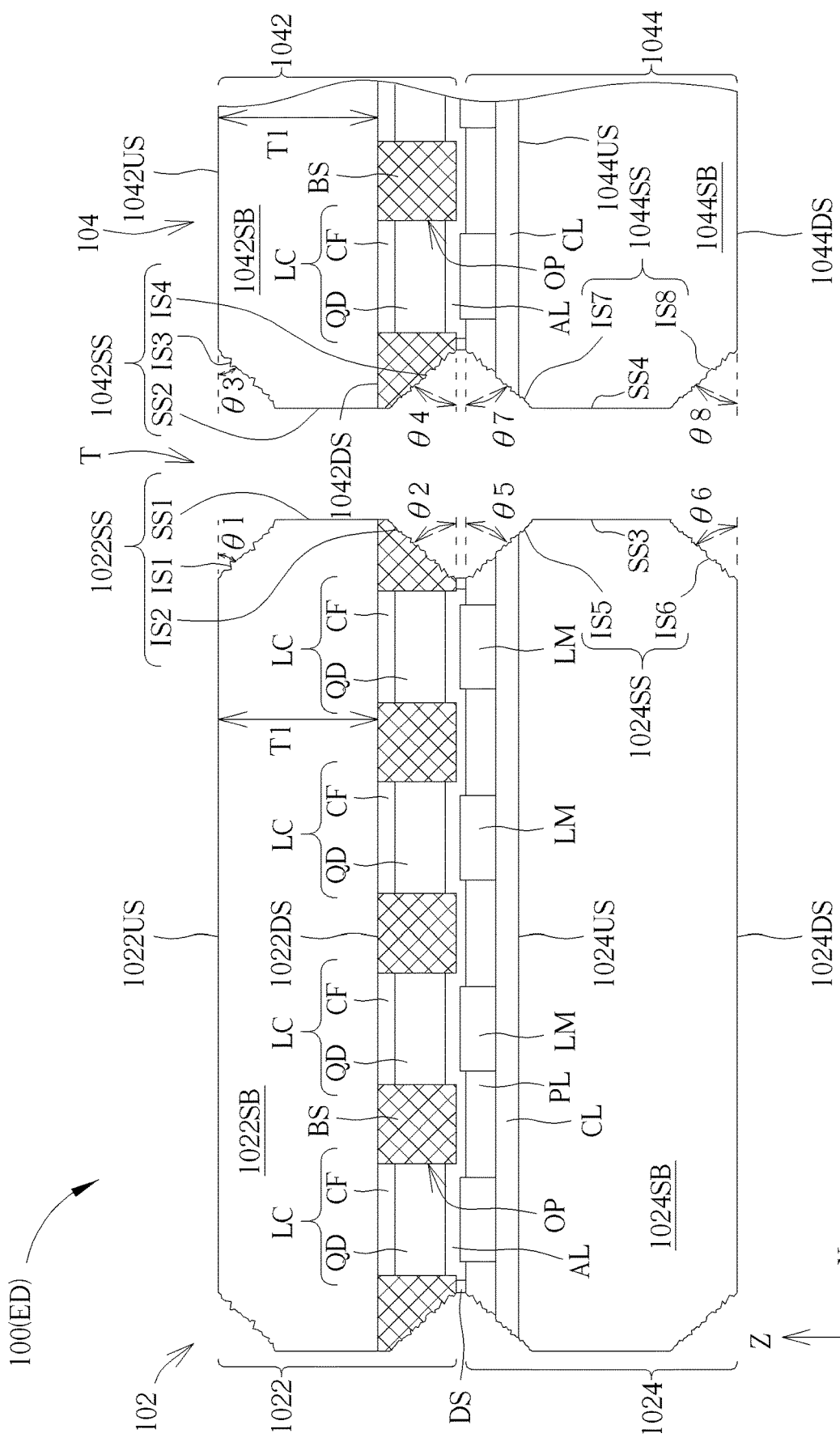
FIG. 4 schematically illustrates a cross-sectional view of the electronic device according to a third embodiment of the present disclosure.

Referring to FIG. 4, FIG. 4 schematically illustrates a cross-sectional view of the electronic device according to a third embodiment of the present disclosure. One of the main differences between this embodiment and the first embodiment shown in FIG. 2 is that the first lower substrate 1024 and the second lower substrate 1044 may include inclined portions in this embodiment. As shown in FIG. 4, in this embodiment, the first side surface 1022SS may include an inclined portion IS1 connected to the first upper surface 1022US, a side portion SS1 and an inclined portion IS2 connected to the first lower surface 1022DS. The second side surface 1042SS may include an inclined portion IS3 connected to the second upper surface 1042US, a side portion SS2 and an inclined portion IS4 connected to the second lower surface 1042DS. The third side surface 1024SS includes an inclined portion IS5 connected to the third upper surface 1024US, a side portion SS3 and an inclined portion IS6 connected to the third lower surface 1024DS. The fourth side surface 1044SS includes an inclined portion IS7 connected to the fourth upper surface 1044US, a side portion SS4 and an inclined portion IS8 connected to the fourth lower surface 1044DS. The formation method of the inclined portions IS1 to IS8 may refer to the above-mentioned embodiments, and will not be redundantly described here. The included angle θ1 between the inclined portion IS1 and the extension line of the first upper surface 1022US, the included angle θ2 between the inclined portion IS2 and the extending direction (such as X direction) of the first lower surface 1022DS, the included angle θ3 between the inclined portion IS3 and the extension line of the second upper surface 1042US, the included angle θ4 between the inclined portion IS4 and the extending direction (such as X direction) of the second lower surface 1042DS, the included angle θ5 between the inclined portion IS5 and the extending direction (such as X direction) of the third upper surface 1024US, the included angle θ6 between the inclined portion IS6 and the extension line of the third lower surface 1024DS, the included angle θ7 between the inclined portion IS7 and the extending direction (such as X direction) of the fourth upper surface 1044US and the included angle θ8 between the inclined portion IS8 and the extension line of the fourth lower surface 1044DS may refer to the included angle θ1 to θ4 in the above-mentioned embodiments, and will not be redundantly described. It should be noted that although the included angle θ1 to θ8 are the same in FIG. 4, the present disclosure is not limited thereto. For example, the included angle θ1 may be the same as the included angle θ2, but different from the included angle θ3 to θ8, or the included angle θ1 to θ8 may be different from each other, the present disclosure is not limited thereto. Because the first side surface 1022SS and/or the second side surface 1042SS include inclined portion IS1 to IS4, after the first panel 102 and the second panel 104 are jointed to form the display device 100 with greater area, the light direction of a portion of the light emitted from the light emitting element LM would be changed due to multiple reflections of the light when it went through the upper surfaces, the lower surfaces, the inclined portions and the side surfaces, such that the output light would not be easily focused on the same direction, and the bright lines or dark lines produced at seam T of the display device 100 due to leakage of light in large viewing angle may be reduced, thereby mitigating the visualization of the seam when users are watching the display device, and the display quality of the display device 100 may be improved, but not limited thereto. The effect of the inclined portion IS5 to IS8 of the display device 100 will be described in the following content, and will not be described here. It should be noted that although the first side surface 1022SS, the second side surface 1042SS, the third side surface 1024SS and the fourth side surface 1044SS shown in FIG. 4 include two inclined portions (that is, inclined portion IS1 to IS8), the present disclosure is not limited thereto. In some embodiments, the first side surface 1022SS may include inclined portion IS1 but not include inclined portion IS2, the second side surface 1042SS may include inclined portion IS3 but not include inclined portion IS4, the third side surface 1024SS may include inclined portion IS5 but not include inclined portion IS6, and the fourth side surface 1044SS may include inclined portion IS7 but not include inclined portion IS8, but not limited thereto. Besides, because the inclined portion may be formed by physical process such as diamond cutting wheel, laser cutting or mechanical grinding, the relative roughness of each of the inclined portions and side portions may be controlled according to the demands. As shown in FIG. 4, the roughness of the side portion SS1 may be different from the roughness of the inclined portion IS1 and inclined portion IS2, the roughness of the side portion SS2 may be different from the roughness of the inclined portion IS3 and inclined portion IS4, the roughness of the side portion SS3 may be different from the roughness of the inclined portion IS5 and inclined portion IS6, and the roughness of the side portion SS4 may be different from the roughness of the inclined portion IS7 and inclined portion IS8, wherein the roughness of the inclined portion IS1 to IS8 may be the same or different from each other, and the roughness of the side portion SS1 to SS4 may be the same or different from each other, the present disclosure is not limited thereto. The roughness difference between the side portion and the inclined portion in this embodiment may be applied to the inclined portion in the above-mentioned embodiments and the following embodiments, and will not be redundantly described.

Figure 5:
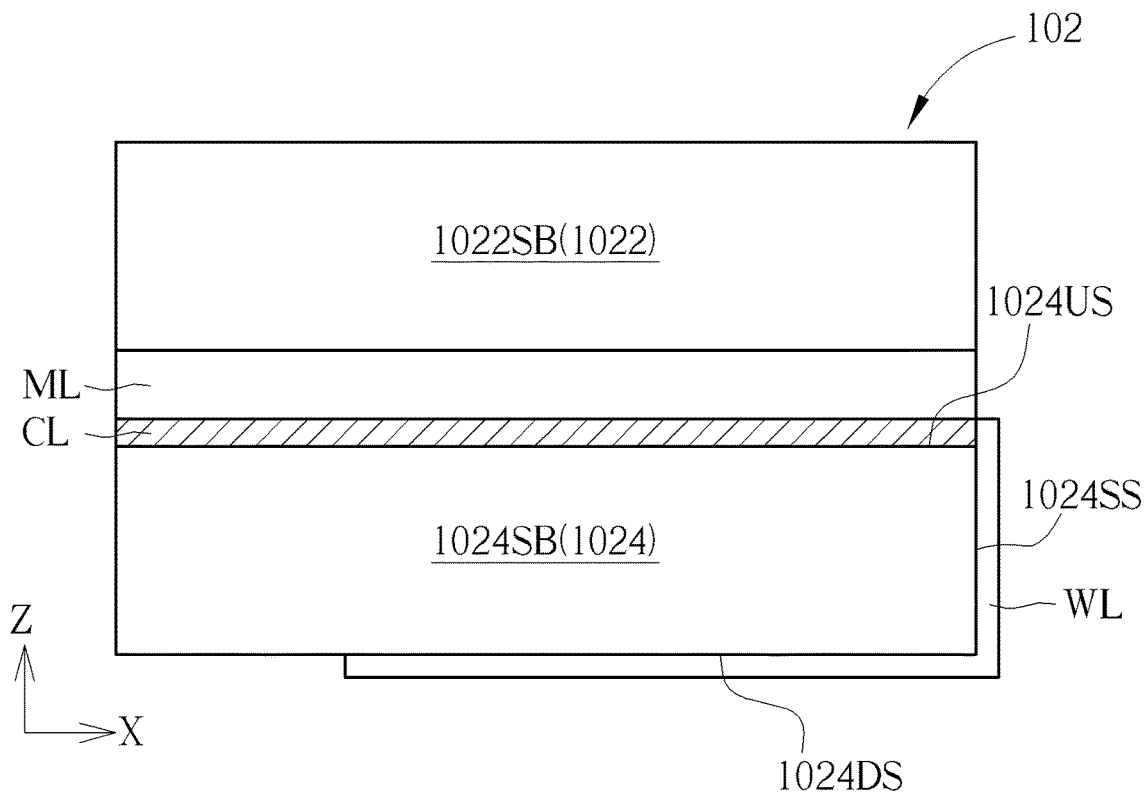
FIG. 5 schematically illustrates a cross-sectional view of the first panel of the electronic device according to an embodiment of the present disclosure.
Figure 6:
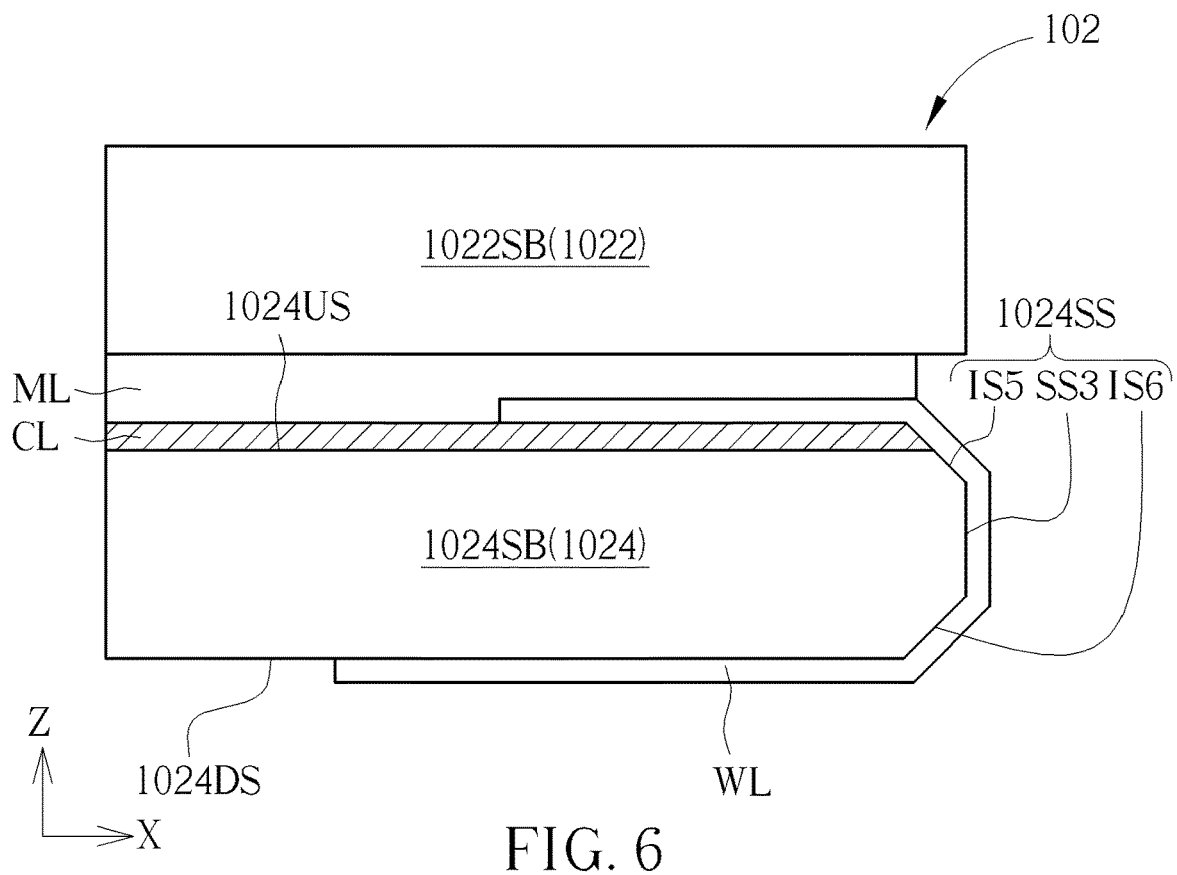
FIG. 6 schematically illustrates a cross-sectional view of the first panel of the electronic device according to another embodiment of the present disclosure.

Refer to FIG. 5 and FIG. 6. FIG. 5 schematically illustrates a cross-sectional view of the first panel of the electronic device according to an embodiment of the present disclosure, FIG. 6 schematically illustrates a cross-sectional view of the first panel of the electronic device according to another embodiment of the present disclosure. The elements included in the first panel 1022 shown in FIG. 5 and FIG. 6 may refer to the first embodiment. In order to emphasize the important features of these two embodiments, some elements shown in FIG. 1 are omitted in FIG. 5 and FIG. 6, besides, FIG. 5 and FIG. 6 only show the first upper base 1022SB, the first lower base 1024SB, the circuit layer CL, the medium layer ML and the conductive lines WL, wherein the medium layer ML may include the light shielding layer BS, the light emitting element LM, the filling layer PL, the encapsulation layer AL, the side sealing material DS, the first conversion layer CF and/or the second conversion layer QD (not shown in FIG. 5 and FIG. 6), but not limited thereto. According to the present disclosure, the control element may for example be disposed on the third lower surface 1024DS of the first lower base 1024SB, and the control element may be electrically connected to the light emitting element LM through conductive lines WL, but not limited thereto. In such design, the disposition space of the elements of the first panel 102 near the seam may be saved. As shown in FIG. 5, the conductive lines WL may be disposed on the third side surface 1024SS and the third lower surface 1024DS of the first lower base 1024SB, and the conductive lines may be electrically connected to the circuit layer CL of the light emitting element. When the conductive lines WL are electrically connected to a control element, signals may be provide to the light emitting elements by the control element. The conductive lines WL may for example be disposed through side printing, but not limited thereto. In some embodiments, the circuit layer CL may extend to the edge of the third upper surface 1024US of the first lower substrate 1024, that is, the edge of the circuit layer CL may be aligned with the third side surface 1024SS. The conductive lines WL may extend from the uppermost of the third side surface 1024SS downward to the bottom of the third side surface 1024SS and to the surface of the third lower surface 1024DS, wherein the conductive lines WL at the uppermost of the third side surface 1024SS may be in contact with the circuit layer CL and electrically connected to the circuit layer CL. Because the third side surface 1024SS in FIG. 5 is perpendicular to the third upper surface 1024US and the third lower surface 1024DS (that is, the third side surface 1024SS does not include inclined portion mentioned in the previous embodiments), the main contact position of the conductive lines WL and the circuit layer CL is the upper right corner of the first lower substrate 1024 in this embodiment. Although it is not shown in FIG. 5, in some embodiments, the conductive lines WL may for example extend along the extending direction of the third side surface 1024SS (such as the Z direction) to the first upper base 1022SB, that is, the conductive lines WL may be disposed on the third side surface 1024SS, the third lower surface 1024DS, and the first side surface 1022SS of the first upper base 1022SB, but not limited thereto. In some embodiments, a portion of the conductive lines WL may be disposed on the circuit layer CL, that is, a portion of the conductive lines WL is located between the first upper base 1022SB and the circuit layer CL. One of the main differences between the embodiment shown in FIG. 6 and the embodiment shown in FIG. 5 is that the third side surface 1024SS in FIG. 6 includes inclined portion IS5 and/or inclined portion IS6. According to the embodiment shown in FIG. 6, the design including the inclined portion IS5 is conducive to the disposition of the conductive lines WL on both the third side surface 1024SS and a portion of the third upper surface 1024US through printing, such that the contact area of the conductive lines WL and the circuit layer CL may be increased, possibility of breaking of the conductive lines may be reduced, and quality of electrical connection between light emitting element and control element may be improved, thereby improving the yields of the first panel 102.

In summary, the inclined portion located on the first upper base 1022SB or the second upper base 1042SB may change the light direction of a portion of the light emitted from the light emitting element LM due to multiple reflections of the light when it went through the upper surfaces, the lower surfaces, the inclined portions and the side surfaces, such that the output light would not be easily focused on the same direction, and the bright lines or dark lines produced at seam T of the display device 100 due to leakage of light in large viewing angle may be reduced, thereby mitigating the visualization of the seam when users are watching the display device, and the display performance of the display device 100 may be improved. The inclined portion located on the first lower base 1024SB or the second lower base 1044SB may increase contact area between the conductive lines and circuit layer, such that the possibility of breaking of the conductive lines may be reduced, but not limited thereto. It should be noted that the inclined portions mentioned above may partially overlap the display region of the first panel 102 and the second panel 104 in a normal direction (such as Z direction), or in some other embodiments, the inclined portion may not be overlapped with the display region of the first panel 102 and the second panel 104, but not limited thereto. The present disclosure provides a display device including an inclined portion on the side surface of the substrate thereof. The display device may improve the display performance of the device near the seam and reduce the possibility of poor contact between the circuits and/or electronic elements due to breaking of conductive lines, thereby improving yields of the display device.

Figure 7:
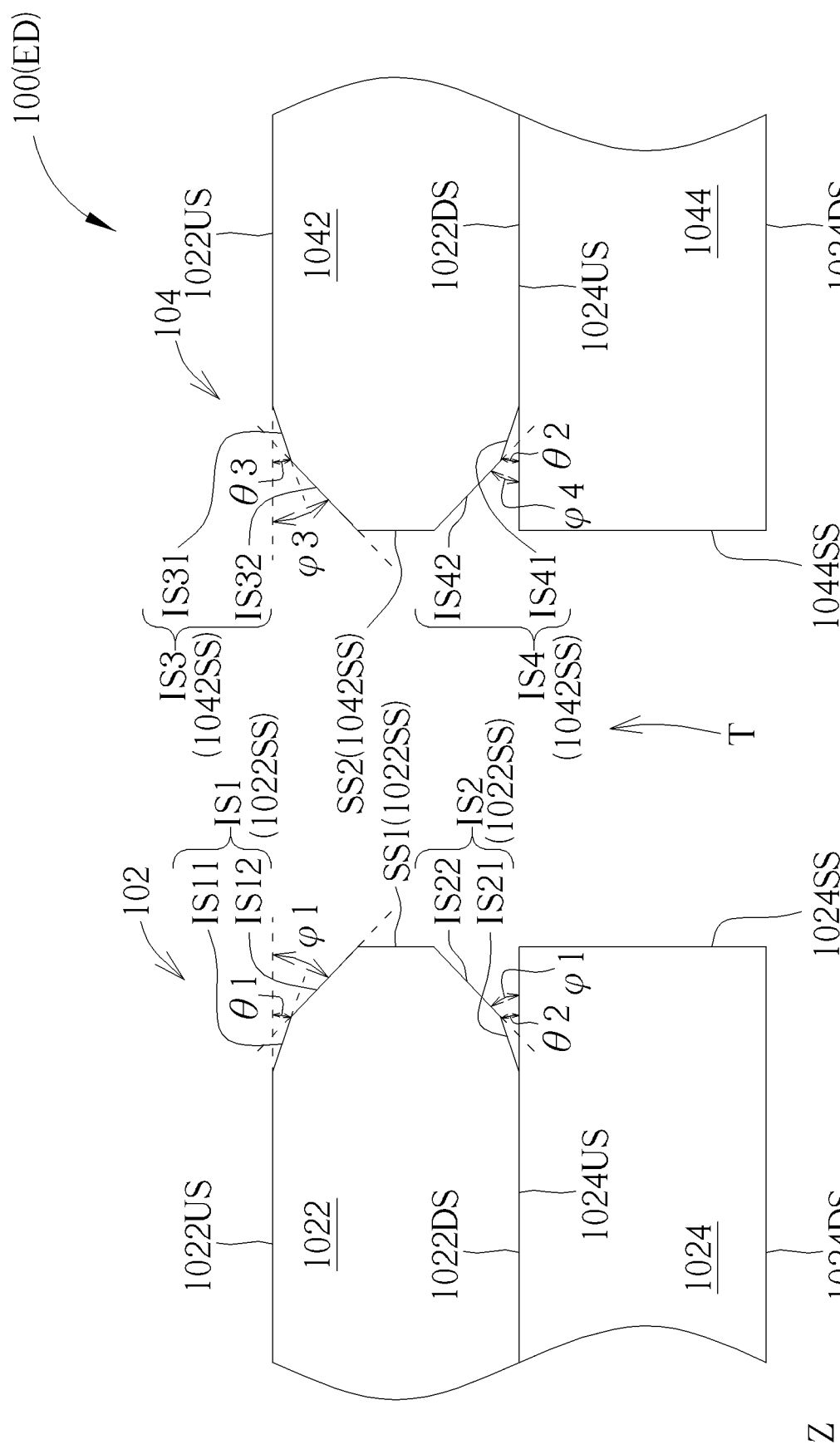
FIG. 7 schematically illustrates a cross-sectional view of the electronic device according to a fourth embodiment of the present disclosure.

Refer to FIG. 7. FIG. 7 schematically illustrates a cross-sectional view of the electronic device according to a fourth embodiment of the present disclosure. In order to simplify the FIGs, FIG. 7 and the FIGs of the following embodiments only show the first upper substrate 1022, the first lower substrate 1024, the second upper substrate 1042 and the second lower substrate 1044. The bases, elements or layers which are not shown in the FIGs may refer to the first embodiment, and will not be redundantly described here. One of the main differences between this embodiment and the first embodiment shown in FIG. 2 is that the design of the inclined portion in this embodiment. As shown in FIG. 7, the first side surface 1022SS of the first panel 102 may include inclined portion IS1, side portion SS1 and inclined portion IS2, the second side surface 1042SS of the second panel 104 may include inclined portion IS3, side portion SS2 and inclined portion IS4. According to this embodiment, the inclined portion IS1 may include a first sub inclined surface IS11 and a second sub inclined surface IS12, wherein the first sub inclined surface IS11 and the second sub inclined surface IS12 are connected; the inclined portion IS2 may include a first sub inclined surface IS21 and a second sub inclined surface IS22, wherein the first sub inclined surface IS21 and the second sub inclined surface IS22 are connected; the inclined portion IS3 may include a first sub inclined surface IS31 and a second sub inclined surface IS32, wherein the first sub inclined surface IS31 and the second sub inclined surface IS32 are connected; the inclined portion IS4 may include a first sub inclined surface IS41 and a second sub inclined surface IS42, wherein the first sub inclined surface IS41 and the second sub inclined surface IS42 are connected, but not limited thereto. The first sub inclined surface IS11 and the extension line of the first upper surface 1022US have an included angle θ1, the first sub inclined surface IS21 and the extending direction (such as X direction) of the first lower surface 1022DS have an included angle θ2, the first sub inclined surface IS31 and the extension line of the second upper surface 1042US have an included angle θ3, and the first sub inclined surface IS41 and the extending direction (such as X direction) of the second lower surface 1042DS have an included angle θ4, wherein the included angle θ1 to θ4 may refer to the first embodiment, and will not be redundantly described here. In this embodiment, the second sub inclined surface IS12 and the extension line of the first upper surface 1022US have another included angle $\phi$1, the second sub inclined surface IS22 and the extending direction (such as X direction) of the first lower surface 1022DS have an included angle $\phi$2, the second sub inclined surface IS32 and the extension line of the second upper surface 1042US have an included angle $\phi$3, and the second sub inclined surface IS42 and the extending direction (such as X direction) of the second lower surface 1042DS have an included angle $\phi$4. The included angel $\phi$1 to $\phi$4 may be ranged from 0 degree to 90 degrees (0°<$\phi$1, $\phi$2, $\phi$3, $\phi$4<90°). For example, the included angel $\phi$1, $\phi$2, $\phi$3 and $\phi$4 may be ranged from 45 degrees to 70 degrees (45°≤$\phi$1, $\phi$2, $\phi$3, $\phi$4≤70°) in this embodiment, but not limited thereto. In this embodiment, the degree of the included angle $\phi$1 may be different from the degree of the inclined angle θ1, the degree of the included angle $\phi$2 may be different from the degree of the inclined angle θ2, the degree of the included angle $\phi$3 may be different from the degree of the inclined angle θ3, and the degree of the included angle $\phi$4 may be different from the degree of the inclined angle θ4, but not limited thereto. The first sub inclined surface (IS11, IS21, IS31 and IS41) and the second sub inclined surface (IS21, IS22, IS32 and IS42) may change the light direction of a portion of the light emitted from the light emitting element LM due to multiple reflections of the light when it went through the upper surfaces, the lower surfaces, the inclined portions (sub inclined surface) and the side surfaces, such that the output light would not be easily focused on the same direction, and the bright lines or dark lines produced at seam T of the display device 100 due to leakage of light in large viewing angle may be reduced, thereby mitigating the visualization of the seam when users are watching the display device, and the display performance of the display device 100 may be improved. Besides, although the first side surface 1022SS and the second side surface 1042SS respectively includes two first sub inclined surfaces and two second sub inclined surfaces in FIG. 7, the first side surface 1022SS, the second side surface 1042SS, the third side surface 1024SS and the fourth side surface 1044SS may respectively include sub inclined surface or not, the present disclosure is not limited thereto. For example, the first side surface 1022SS, the second side surface 1042SS, the third side surface 1024SS and the fourth side surface 1044SS may include two first sub inclined surfaces and two second sub inclined surfaces respectively located at two sides of the corresponding side portion in some embodiments, or, in some other embodiments, the first side surface 1022SS includes the first sub inclined surface IS11 and the second sub inclined surface IS12, but not include the first sub inclined surface IS21 and the second sub inclined surface IS22; the second side surface 1042SS includes the first sub inclined surface IS31 and the second sub inclined surface IS32, but not include the first sub inclined surface IS41 and the second sub inclined surface IS42, but not limited thereto. It should be noted that when the third side surface 1024SS of the first lower substrate 1024 and/or the fourth side surface 1044SS of the second lower substrate 1044 include sub inclined surface, the possibility of breaking of the conductive lines which electrically connects the light emitting element and the control element would be decreased when the conductive lines are extended to the lower surface of the lower substrate (such as the third lower surface 1024DS of the first lower substrate 1024 or the fourth lower surface 1044DS of the second lower substrate 1044), thereby improving the yields of the display device 100. Besides, although the inclined portions in FIG. 7 only include two sub inclined surface, the present disclosure is not limited thereto. In some embodiments, each of the inclined portions may include three or more sub inclined surfaces, but not limited thereto.

Figure 8:
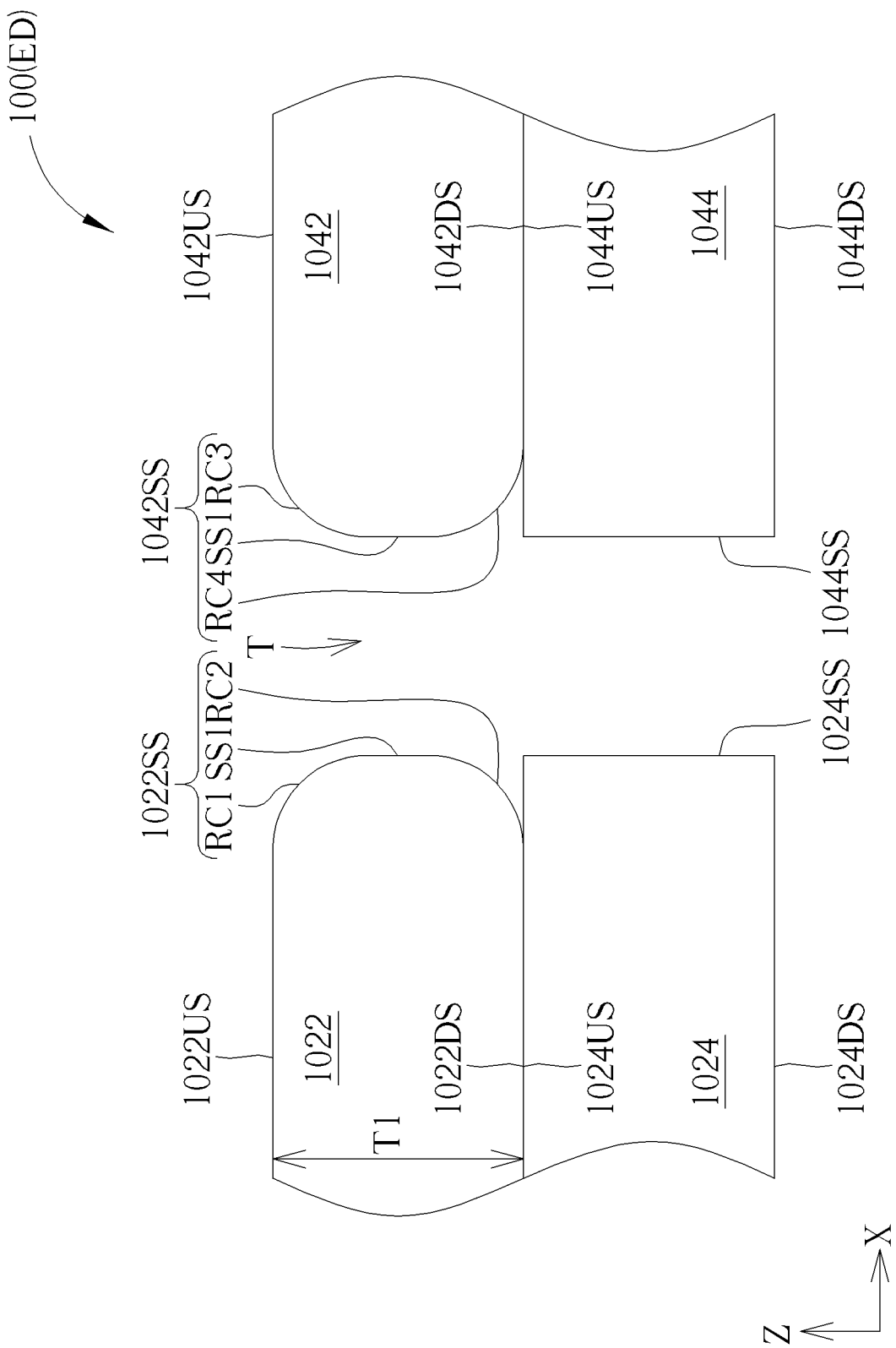
FIG. 8 schematically illustrates a cross-sectional view of the electronic device according to a fifth embodiment of the present disclosure.

Refer to FIG. 8. FIG. 8 schematically illustrates a cross-sectional view of the electronic device according to a fifth embodiment of the present disclosure. One of the main differences between this embodiment and the first embodiment shown in FIG. 1 is that the side surface in this embodiment may include curved portion but not inclined portion. As shown in FIG. 8, the first side surface 1022SS of the first upper substrate 1022 of the display device 100 may include curved portion RC1, side portion SS1 and curved portion RC2, wherein the curved portion RC1 is connected to the first upper surface 1022US, and the curved portion RC2 is connected to the first lower surface 1022DS. The second side surface 1042SS of the second upper substrate 1042 may include curved portion RC3, side portion SS2 and curved portion RC4, wherein the curved portion RC3 is connected to the second upper surface 1042US, and the curved portion RC4 is connected to the second lower surface 1042DS. The formation method of the curved portion may refer to the formation method of inclined portion mentioned above, and will not be redundantly described. The curved portion mentioned above is the portion from the part that is not substantially parallel to the upper surface or lower surface to the part that is not substantially parallel to the side surface. According to this embodiment, the curvature of the curved portion RC1, curved portion RC2, the curved portion RC3 and the curved portion RC4 may be range from 0.01 times to 1 time of the thickness T1 of the first upper substrate 1022 (that is, 0.01T1≤curvature≤T1), but not limited thereto. For example, the curvature of the curved portion RC1, the curved portion RC2, the curved portion RC3 and the curved portion RC4 may be 0.1T1, 0.2T1, 0.3T1 or 0.4T1, but not limited thereto. In some embodiments, the curvature of the curved portion may be determined according to the thickness of the base which the side surface of the curved portion belongs to. In detail, the curvatures of the curved portion RC1 and the curved portion RC2 are between 0.01 times to 1 time of the thickness (such as thickness T1) of the first upper substrate 1022, and the curvatures of the curved portion RC3 and the curved portion RC4 are between 0.01 times to 1 time of the thickness (may be the same as the thickness T1 of the first upper substrate 1022 or not, which is not limited in the present disclosure) of the second upper substrate 1042, but not limited thereto. Besides, although the curvature of the curved portion RC1, RC2, RC3 and RC4 are the same in FIG. 8, the present disclosure is not limited thereto. In some embodiments, the curvature of the curved portion RC1, RC2, RC3 and RC4 may be different from each other, but not limited thereto. Furthermore, although the display device 100 shown in FIG. 8 only includes curved portion at the first side surface 1022SS and the second side surface 1042SS, the present disclosure is not limited thereto. The first side surface 1022SS, the second side surface 1042SS, the third side surface 1024SS and the fourth side surface 1044SS may respectively include curved portion or not in this embodiment. For example, the first side surface 1022SS, the second side surface 1042SS, the third side surface 1024SS and the fourth side surface 1044SS may respectively include two curved portions respectively connected to the corresponding upper surface and the corresponding lower surface, or in some embodiments, the first side surface 1022SS may include a curved portion connected to the first upper surface 1022US, the second side surface 1042SS may include a curved portion connected to the second upper surface 1042US, and the third side surface 1024SS and the fourth side surface 1044SS may not include curved portion, but not limited thereto. According to this embodiment, the curved portion may change the light direction of a portion of the light emitted from the light emitting element due to multiple reflections of the light when it went through the upper surfaces, the curved portions and the side surfaces, such that the output light would not be easily focused on the same direction, and the bright lines or dark lines produced at seam T of the display device 100 due to leakage of light in large viewing angle may be reduced, thereby mitigating the visualization of the seam when users are watching the display device, and the display performance of the display device 100 may be improved. Besides, if the third side surface 1024SS and the fourth side surface 1044SS include curved portion, the possibility of breaking of the conductive lines which electrically connects the light emitting element and the control element would be decreased when the conductive lines are extended to the lower surface of the lower substrate, thereby improving the yields of the display device 100.

Figure 9:
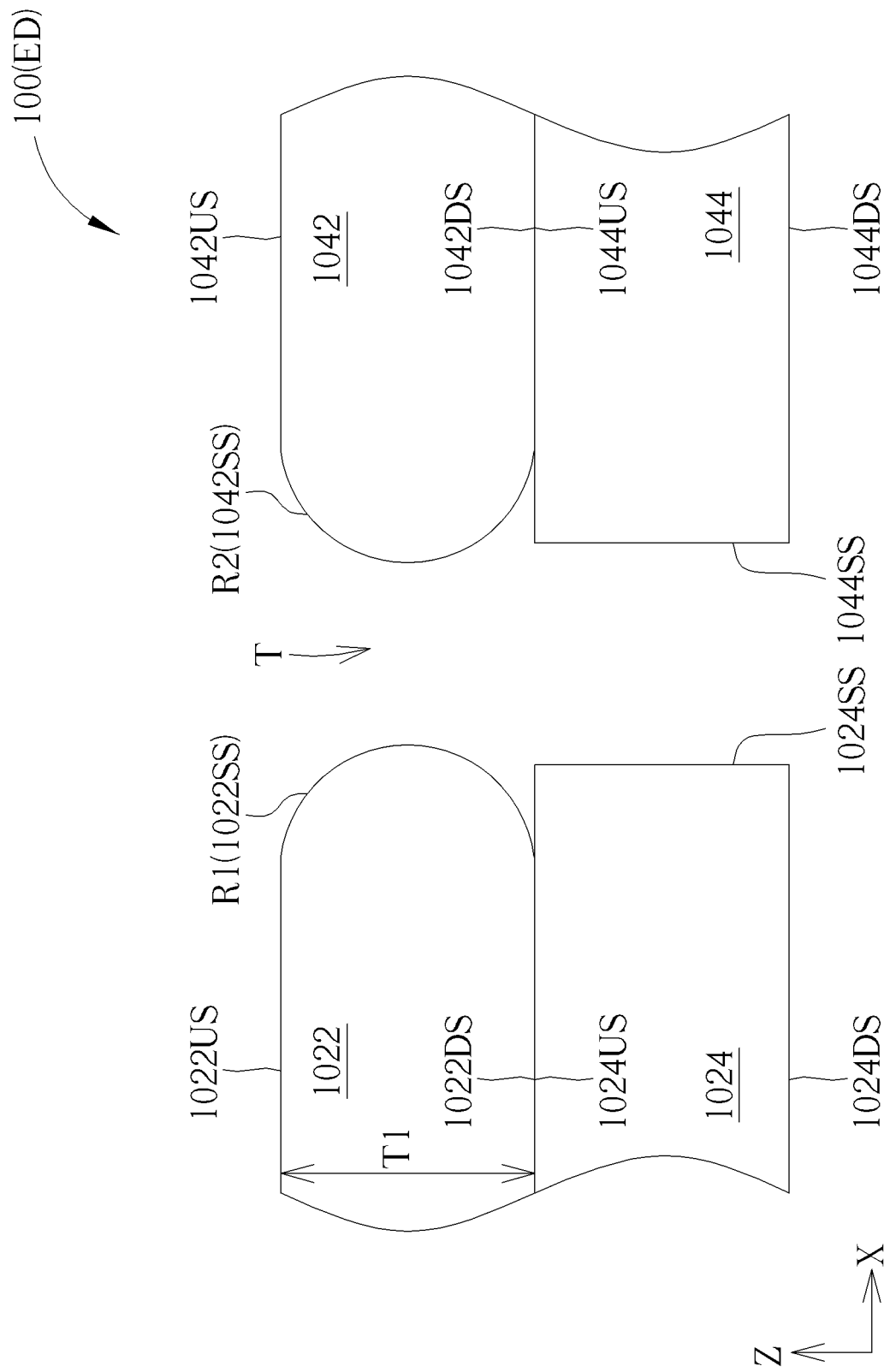
FIG. 9 schematically illustrates a cross-sectional view of the electronic device according to a sixth embodiment of the present disclosure.

Refer to FIG. 9. FIG. 9 schematically illustrates a cross-sectional view of the electronic device according to a sixth embodiment of the present disclosure. One of the main differences between this embodiment and the first embodiment shown in FIG. 1 is that the side surface in this embodiment may include curved portion but not inclined portion. As shown in FIG. 9, the first side surface 1022SS of the first upper substrate 1022 of the display device 100 may include curved portion R1, and the second side surface 1042SS of the second upper substrate 1042 may include curved portion R2, wherein the curved portion R1 may be connected to the first upper surface 1022US and the first lower surface 1022DS, and the curved portion R2 may be connected to the second upper surface 1042US and the second lower surface 1042DS. The formation method of the curved portion may be the same as the formation method of the inclined portion mentioned above, and will not be redundantly described here. In this embodiment, the curvature of the curved portion R1 and the curved portion R2 may be ranged from 0.5T1 to 10000T1 (0.5T1≤curvature≤10000T1), wherein T1 is the thickness of the first upper substrate 1022 (or the second upper substrate 1042). For example, the curvature of the curved portion R1 and the curved portion R2 may be 0.5T1, 0.6T1 or 0.7T1, but not limited thereto. In some embodiments, the curved portions (R1 and R2) may at least partially overlap the display region of the first panel 102 or the second panel 104 in a normal direction (such as Z direction) of the first panel. In some other embodiments, the curved portion R1 and the curved portion R2 may not be overlapped with the display region of the first panel 102 or the second panel 104 on a normal direction (such as Z direction) of the first panel. Thus, the curved portion R1 and the curved portion R2 may have any suitable curvature. Besides, as mentioned above, the curvature of the curved portion may be determined according to the thickness of the substrate which the side surface of the curved portion belongs to in some embodiments, and is not determined by the thickness of a single substrate. Although the display device shown in FIG. 9 only includes curved portions at the first side surface 1022SS and the second side surface 1042SS, the present disclosure is not limited thereto. In some embodiments, the first side surface 1022SS, the second side surface 1042SS, the third side surface 1024SS and the fourth side surface 1044SS may include curved portion, and the curvatures of the curved portion of the first side surface 1022SS, the second side surface 1042SS, the third side surface 1024SS and the fourth side surface 1044SS may be the same or different from each other, but not limited thereto. According to this embodiment, the curved portion may change the light direction of a portion of the light emitted from the light emitting element due to multiple reflections of the light when it went through the upper surfaces, the curved portions and the side surfaces, such that the output light would not be easily focused on the same direction, and the bright lines or dark lines produced at seam T of the display device 100 due to leakage of light in large viewing angle may be reduced, thereby mitigating the visualization of the seam when users are watching the display device, and the display performance of the display device 100 may be improved. Besides, if the third side surface 1024SS and the fourth side surface 1044SS include curved portion, the possibility of breaking of the conductive lines which electrically connects the light emitting element and the control element would be decreased when the conductive lines are extended to the lower surface of the lower substrate, thereby improving the yields of the display device 100.

Figure 10:
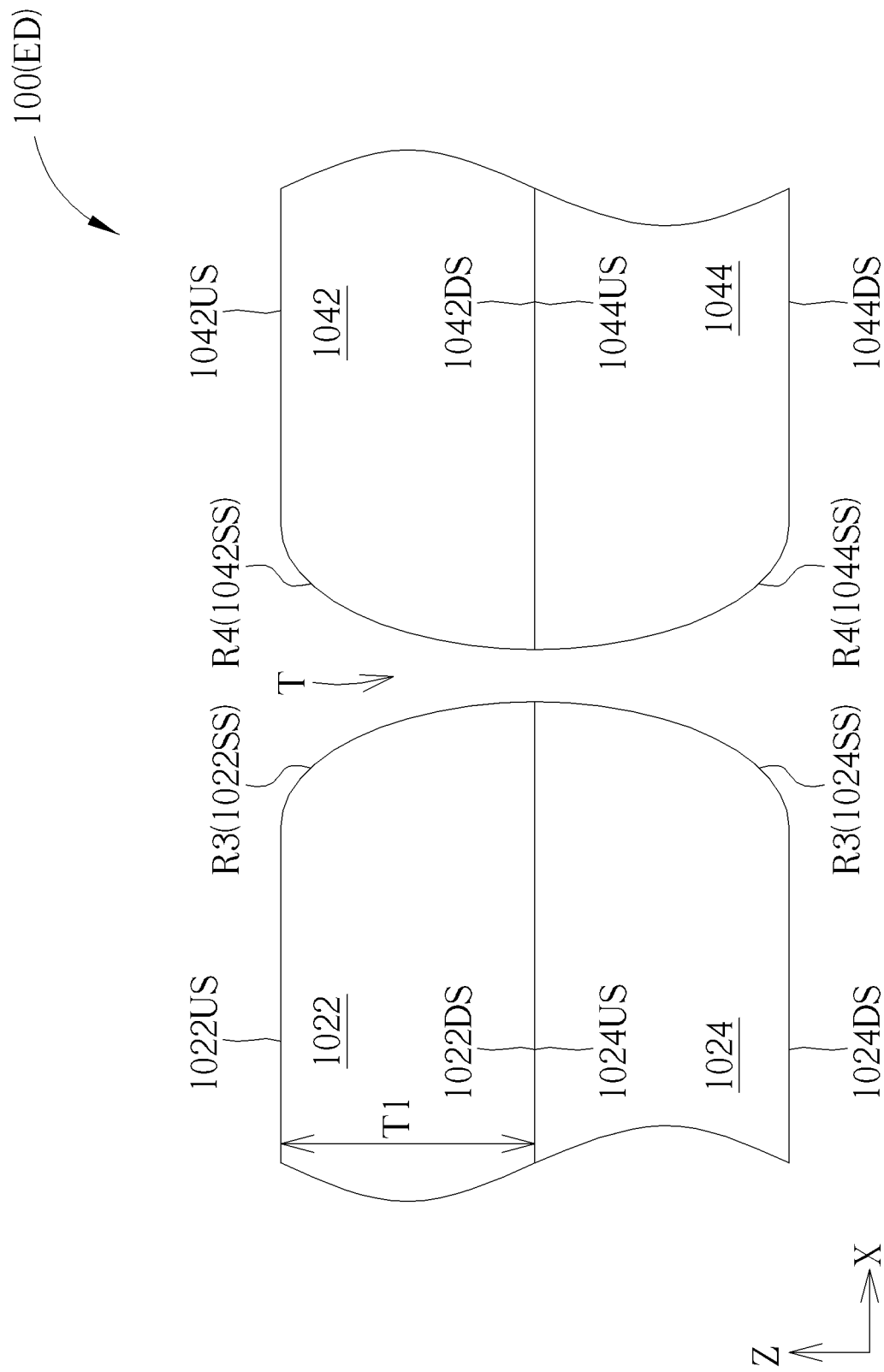
FIG. 10 schematically illustrates a cross-sectional view of the electronic device according to a seventh embodiment of the present disclosure.

Refer to FIG. 10. FIG. 10 schematically illustrates a cross-sectional view of the electronic device according to a seventh embodiment of the present disclosure. In this embodiment, the first side surface 1022SS of the first upper substrate 1022 and the third side surface 1024SS of the first lower substrate 1024 may forma curved portion R3, and the second side surface 1042SS of the second upper substrate 1042 and the fourth side surface 1044SS of the second lower substrate 1044 may form a curved portion R4, wherein an edge of the curved portion R3 is connected to the first upper surface 1022US, another edge of the curved portion R3 is connected to the third lower surface 1024DS, an edge of the curved portion R4 is connected to the second upper surface 1042US, and another edge of the curved portion R4 is connected to the fourth lower surface 1044DS. According to this embodiment, the curvature of the curved portion R3 and the curved portion R4 may be ranged from 0.5T1 to 10000T1 (0.5T1≤curvature≤10000T1), wherein T1 is the thickness of the first upper substrate 1022 (or the second upper substrate 1042). For example, the curvature of the curved portion R3 and the curved portion R4 may be T1 in this embodiment, but not limited thereto. In some embodiments, the curved portion R3 and the curved portion R4 may at least partially overlap the display region of the first panel 102 and the second panel 104 in a normal direction (such as Z direction) of the first panel. In some other embodiments, the curved portion R3 and the curved portion R4 may not be overlapped with the display region of the first panel 102 or the second panel 104 in a normal direction (such as Z direction) of the first panel. Thus, the curved portion R3 and the curved portion R4 may have any suitable curvature according to the demands. Besides, although the curvature of the curved portion R3 and the curved portion R4 are the same in FIG. 10, the present disclosure is not limited thereto. In some embodiments, the curvature of the curved portion R3 may be different from the curvature of the curved portion R4. In some embodiments, the curved portion R3 and the curved portion R4 may have the same center of curvature. In some other embodiments, the center of curvature of curved portion R3 may not overlap the center of curvature of curved portion R4. The curved portion R3 and the curved portion R4 in this embodiment may change the light direction of a portion of the light emitted from the light emitting element due to multiple reflections of the light when it went through the upper surfaces, the curved portions and the side surfaces, such that the output light would not be easily focused on the same direction, and the bright lines or dark lines produced at seam T of the display device 100 due to leakage of light in large viewing angle may be reduced, thereby mitigating the visualization of the seam when users are watching the display device, and the display performance of the display device 100 may be improved. Besides, the possibility of breaking of the conductive lines which electrically connects the light emitting element and the control element would be decreased when the conductive lines are extended to the lower surface of the lower substrate, thereby improving the yields of the display device 100.

In summary, a tiled display device including a plurality of panels is provided in the present disclosure, wherein the side surface of the substrate (including upper substrate and lower substrate) of the panel may have different design. For example, an inclined portion or curved portion may be included in the same substrate, or the inclined portion or curved portion may be included in different substrates. That is, the side surfaces of the substrates may have identical design or different designs chosen from the above-mentioned embodiments according to the demands. The inclined portions or curved portions at the side surface of the upper substrate may reduce the bright lines or dark lines produced at the seam of the display device. The inclined portions or curved portions at the side surface of the lower substrate may reduce the possibility of breaking of the conductive lines when the conductive lines are extended to the lower surface of the substrate. The yields of the tiled display device may be improved by these different designs at the side surface of the substrate.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A tiled display device comprising:
a first panel including a first lower substrate and a first upper substrate disposed opposite to the first lower substrate, wherein the first upper substrate includes a first upper surface, a first lower surface and a first side surface, and the first side surface is located between the first upper surface and the first lower surface; and
a second panel disposed adjacent to the first panel, wherein the second panel includes a second lower substrate and a second upper substrate disposed opposite to the second lower substrate, the second upper substrate includes a second upper surface, a second lower surface and a second side surface, the second side surface is located between the second upper surface and the second lower surface, and the second side surface is disposed adjacent to the first side surface;
wherein a portion of the first side surface is not perpendicular to the first upper surface or the first lower surface, and a portion of the second side surface is not perpendicular to the second upper surface or the second lower surface; wherein the portion of the first side surface includes an inclined portion connected to the first upper surface.

2. The tiled display device of claim 1, wherein the first side surface further includes a side portion perpendicular to the first upper surface, and a roughness of the side portion is different from a roughness of the inclined portion.

3. The tiled display device of claim 1, wherein the inclined portion includes a first sub inclined surface and a second sub inclined surface, the second sub inclined surface is connected to the first sub inclined surface, the first sub inclined surface and an extension line of the first upper surface have an included angle, the second sub inclined surface and the extension line of the first upper surface have an another included angle, and the included angle is different from the another included angle.

4. The tiled display device of claim 3, wherein the included angle ranges from 20 degrees to 45 degrees.

5. The tiled display device of claim 3, wherein the another included angle ranges from 45 degrees to 70 degrees.

6. The tiled display device of claim 1, wherein the first side surface includes two inclined portions, and the two inclined portions are respectively connected to the first upper surface and the first lower surface.

7. The tiled display device of claim 1, wherein the portion of the second side surface includes an inclined portion connected to the second upper surface.

8. The tiled display device of claim 1, wherein the portion of the second side surface includes two inclined portions, and the two inclined portions are respectively connected to the second upper surface and the second lower surface.

9. The tiled display device of claim 1, wherein the first side surface includes a curved portion connected to the first upper surface.

10. The tiled display device of claim 1, wherein the first side surface includes two curved portions connected to the first upper surface and the first lower surface respectively.

11. The tiled display device of claim 1, wherein the portion of the second side surface includes a curved portion connected to the second upper surface.

12. The tiled display device of claim 1, wherein the portion of the second side surface includes two curved portions connected to the second upper surface and the second lower surface respectively.

13. The tiled display device of claim 1, wherein the first side surface includes a curved portion connected to the first upper surface and the first lower surface.

14. The tiled display device of claim 1, wherein the portion of the second side surface includes a curved portion connected to the second upper surface and the second lower surface.

15. The tiled display device of claim 1, wherein the first lower substrate includes a third upper surface, a third lower surface and a third side surface, the third side surface is located between the third upper surface and the third lower surface, and a portion of the third side surface is not perpendicular to the third upper surface or the third lower surface.

16. The tiled display device of claim 15, wherein the portion of the third side surface includes an inclined portion or a curved portion.

17. The tiled display device of claim 1, wherein the second lower substrate includes a fourth upper surface, a fourth lower surface and a fourth side surface, the fourth side surface is located between the fourth upper surface and the fourth lower surface, and a portion of the fourth side surface is not perpendicular to the fourth upper surface or the fourth lower surface.

18. The tiled display device of claim 17, wherein the portion of the fourth side surface includes an inclined portion or a curved portion.

19. The tiled display device of claim 1, further comprising a cover substrate disposed on the first panel.

\* \* \* \* \*